United States Patent [19]
Ghose

[11] Patent Number: 5,014,061
[45] Date of Patent: May 7, 1991

[54] ADAPTIVE MULTIFREQUENCY SIGNAL COMBINING SYSTEM

[75] Inventor: Rabindra N. Ghose, Los Angeles, Calif.

[73] Assignee: Technology Research International, Calabasas, Calif.

[21] Appl. No.: 341,844

[22] Filed: Apr. 24, 1989

[51] Int. Cl.$^5$ ............................................. G01S 13/78
[52] U.S. Cl. ........................................ 342/45; 342/89; 342/100; 342/111; 342/116
[58] Field of Search ...................... 342/45, 51, 44, 89, 342/98–103, 111, 112, 116, 195, 129

[56] References Cited

U.S. PATENT DOCUMENTS

| | | | |
|---|---|---|---|
| 3,727,220 | 4/1973 | Brennan et al. | 342/89 |
| 4,237,461 | 12/1980 | Cantrell et al. | 342/194 |
| 4,373,190 | 2/1983 | Lewis et al. | 364/715 |
| 4,400,700 | 8/1983 | Rittenbach | 342/100 |
| 4,417,249 | 11/1983 | Zscheille, Jr. | 342/379 |
| 4,513,383 | 4/1985 | Hackett, Jr. | 364/517 |
| 4,616,231 | 10/1986 | Autrey et al. | 342/374 |
| 4,622,552 | 11/1986 | Andrews et al. | 342/196 |
| 4,626,858 | 12/1986 | Copeland | 342/374 |
| 4,641,141 | 2/1987 | Masak | 342/379 |
| 4,694,298 | 9/1987 | Milan | 342/89 |
| 4,701,762 | 10/1987 | Apostolos | 342/417 |
| 4,719,466 | 1/1988 | Farina et al. | 342/159 |
| 4,771,287 | 9/1988 | Mims | 342/25 |
| 4,847,622 | 7/1989 | Maitre et al. | 342/110 |
| 4,879,561 | 11/1989 | Inkol | 342/195 |

Primary Examiner—Thomas H. Tarcza
Assistant Examiner—John B. Sotomayor
Attorney, Agent, or Firm—Rabindra N. Ghose

[57] ABSTRACT

Apparatus and methods for combining incoherent signals having different carrier frequencies but a common modulation to obtain a coherent summation of the modulations of such signals are described. The apparatus comprises adaptive means of changing the carrier frequencies and corresponding phases of various signals to a common carrier frequency and a common phase, thus enabling the coherent summation of the common modulation and enhancing, thereby, the level of received information content. When the incoherent signals are transponder-signals, radiated from an object or platform in response to a modulated interrogating signal, and are obtained by different frequency offsets from the interrogating signal carrier frequency, the particular offset frequencies being unique to that object or platform, the ability combining of modulations coherently provides a means of unique identification of the object or platform.

12 Claims, 3 Drawing Sheets

INTERROGATING RADAR STATION

ADAPTIVE MULTIFREQUENCY SIGNAL COMBINING SYSTEM

BACKGROUND OF THE INVENTION

1. Field of Invention

This invention is in the field of signal processing to enhance the effective signal to noise ratio of the received signal by coherently summing the signals with different carrier frequencies and carrier phases but with a common modulation.

2. Related Art

An adaptive phased array, where the signals with a common carrier frequency and a common modulation, but with different carrier phases, are summed in phase, may be regarded as a relevant prior art. When the incident signals have different carrier frequencies, the in-phase summation concept by adjusting weights in the antenna element circuits, is no longer effective. Also, when signals are not summed in phase, no improvement of the signal-to-noise ratio of the received signal can result. The present invention comprising means and method to sum the signals with a common modulation, but having different carrier frequencies and carrier phases, provide an improvement in effective signal-to-noise ratio.

The communication between a moving platform, such as an airplane or a ship, and a ground station, becomes ineffective as the distance between the platform and ground station exceeds a certain limit that depends primarily on the transmitter power of the communication system. When an effective communication of information to the platform is necessary at all times, a number of ground stations, each transmitting the same information, are used on the basis that the platform will be close to at least one of the ground stations to receive the information. To avoid a destructive interference among the signals transmitted by many ground stations the platform tunes to the frequency of its closest ground station. The same number of ground stations can be used to communicate with many moving or fixed platforms, thus making the communication network more cost effective when there are more than one moving platform. When the location of the platform is very arbitrary over a very large area, the number of ground stations necessary for a reliable communication could be prohibitively large. Since the information communicated by each ground station is the same, the number of ground stations can be significantly reduced if one could sum the information coherently. But the information is contained in the modulation of the signal transmitted by each ground station. Thus a coherent summation of the common modulations of the otherwise incoherent transmitted signals from various ground stations as received at the platform, will greatly enhance communication effectiveness because of the equivalent added signal strength. One objective of the invention is to sum coherently the common modulation when the carrier frequencies and phases of the signals are not the same and are changing with time.

Another objective of the invention on combining multifrequency signals with a common modulation, is to provide a unique identification means for a given platform. Thus, when a modulated interrogating signal is communicated to a platform and the platform, in turn, acts as a transponder sending out a plurality of signals each having a carrier frequency which is obtained by a frequency offset from the carrier frequency of the interrogating signal, the total radiated transponder signal from the platform may be viewed as a set of multifrequency signals having different carrier frequencies and carrier phases but having a common modulation. If the set of offset frequencies are unique to a platform, then combining the modulations at these specific offset frequencies provides a means of recognition of that particular platform. Moreover, if the set of offset frequencies to be used at the platform is not known to the receiver of the multifrequency signals, no signal combining will be possible. Hence a system can be designed such that the identification of a platform can only be possible by an authorized interrogating statio to synchronize the carrier frequencies and their phases for a number of signals. Such a synchronization by adaptive means requiring no a priori information on the characteristics of the signal or its modulation is the key element of the present invention. No prior art on this specific aspect of the invention is known to this inventor.

Differences between this invention and any related prior arts will be apparent from the specifications, drawings, and claims that follow.

SUMMARY OF THE INVENTION

The inventive apparatus and method described herein provide means of combining a plurality of modulated signals at different frequencies and phases, but all having a common modulation, so that the combined modulation-signal strength becomes the sum of the modulation signal strength of each signal. The apparatus comprises adaptive means of changing the carrier frequencies and corresponding phases of the signals to a common carrier frequency and a common phase, so that the signals can then be summed coherently to enhance the effective signal strength.

To further explain the advantage of the inventive apparatus, let it be assumed that a number of broadcast signals originating from different locations and having different carrier frequencies but a common modulation, arrive at a receiving antenna. The output of the antenna containing a combination of various signals is often of little value because of the incoherent nature of the signals which may interfere with one another. If now the receiving antenna is connected to an antenna-multicoupler having as many output ports as the number of signals present at the antenna, and if each such output port is tuned to one of the signal carrier frequencies, one can separate the signals and detect and use that signal which is the strongest, discarding the remaining signals. If, however, the signal-to-noise ratio of the strongest signal thus selected, is not adequate for an effective communication with a tolerable message error, the need for coherent summation as used in the inventive apparatus becomes worthy of consideration.

Let one of the output ports of abovesaid multicoupler be tuned to the carrier frequency of a signal and this tunned signal be mixed with the signal from a voltage-controlled oscillator (VCO). The output of the mixer willl contain a signal, the frequency of which will be the difference between the tuned carrier frequency and the frequency of the VCO signal, and the phase of which will be the difference between the phase of the tuned carrier and that of the VCO signal. Let this mixer output be compared with the signal from a stable local oscillator by a phase detector, so that the phase detector output will contain a signal, the frequency and phase of which will be respectively the difference in frequency between the signals from the mixer output and the stable oscillator and the difference in phase between the same two signals. When this output of the phase detector is used to control the VCO, the frequency and phase of the VCO signal will change continuously until, at the equilibrium condition, the frequency and phase of the mixer-output signal become respectively the same as the frequency and phase of the stable oscillator. Since the VCO merely shifts the carrier frequency and phase without affecting the modulation, the output of the mixer at the equilibrium condition of the VCO will contain a signal whose carrier frequency and phase are changed to those of the stable oscillator, respectively, while the modulation remains unchanged. Similarly, if the signal at each output port of abovesaid antenna multicoupler is tuned to the carrier frequency of one of the broadcast signals present at the receiving antenna, and if a separate closed-loop comprised of a separate mixer, VCO and phase detector, as described above, with the same stable oscillator is used for each output of said mixer, this output will contain a signal which will have the same modulation as that of the oncoming signals at the receiving antenna and the same frequency and phase as that of the stable oscillator signal. Thus the outputs of the mixers will contain coherent signals having the same carrier frequency, phase, and modulation, and their sum will provide an enhanced signal strength and an increased signal-to-noise ratio.

The advantage of coherent summation of signals is not limited to broadcast signals. The approach, for example, can be used in conjunction with an interrogating radar to establish an Identification, Friend-Foe (IFF) system for a moving platform where the access to the identification signal is available only to the authorized interrogating radar. To explain this approach further, let a radar transmit its interrogating signal to a moving platform. At the platform the received radar signal is amplified and split into N parts by a N-port power divider. The carrier frequency of the signal at each output port of the power divider is then offset by a mixer and an offset frequency oscillator, so that one obtains N different signals, each having a different carrier frequency but the same modulation, which is the same as that of the interrogating radar. If these N signals are transmitted from the platform back to the radar as transponder signals, by one or more transmitting antennas at the platform, the received signals at the radar receiver will be similar to the broadcast signals considered earlier where a number of signals at different carrier frequencies but a common modulation appears at the receiving antenna. In this case, the separation of signals is more easily effected by first hetrodyning the received signal with the radar carrier so that the mixer outputs following appropriate filtering become signals the carrier frequency of which are the same as the offset frequencies introduced at the interrogated platform, while their modulation remains the same as that of the radar. These signals can now be summed coherently by the VCO, mixer and phase detector assembly as described above. The coherent summation of signals, however, is only possible in such a case when the discrete set of offset frequencies for a platform are known at the interrogating radar and appropriate filters are introduced following hetrodyning to recover the signals. If wrong filters are used instead, there will be no filter-output and hence no signal combining can be effected. When a discrete set of offset frequencies are unique to a platform, as will usually be the case, the level of the coherently summed signal for the set of offset filters corresponding to the interrogated platform will indicate whether an identification response from that particular platform has been received. The time delay in response from the platform measured from the initial transmission and the orientation of the radar antenna can then determine the distance and location of the target from the radar. The advantage of this type of identification system is that the response from the interrogated platform cannot be effectively received by any receiver that has no a-priori knowledge of the set of discrete offset frequencies being used by the platform. The use of such offset frequencies that extend over a wide frequency band makes the detection of the platform by an unauthorized receiver even more difficult. Also, because of the high directivity gain of the radar antenna, a relatively less transmitted power is necessary at the platform for responding to the interrogation by the radar.

In addition to transmitting the identification signal in response to a radar interrogation, it is possible to carry out a limited communication from the platform to the radar, by changing the offset frequencies at the platform with time according to a coded sequence.

Further objectives and advantages of the invention will become apparent from the study of the following portion of the specifications, the claims and the attached drawings.

DESCRIPTION OF THE PREFERRED EMBODIMENTS

Many times it is desirable for several signals at different carrier frequencies but with a common modulation, be combined to enhance the effective signal strength. Broadcast of weather information or critical warning signals to moving platforms, transmitted from different locations at different carrier frequencies to avoid mutual interferences, but with a common message, are examples of such signals. These signals are intended for ships and airplanes, each of which is likely to be close to at least one of the transmitting stations to ensure receiving the message. Sometimes, however, there are many fringe areas where the signal received from the closest transmitting station is inadequate and other signals which are also inadequate individually cannot be used because the signals are at different carrier frequencies and hence cannot be summed.

Figure 1:
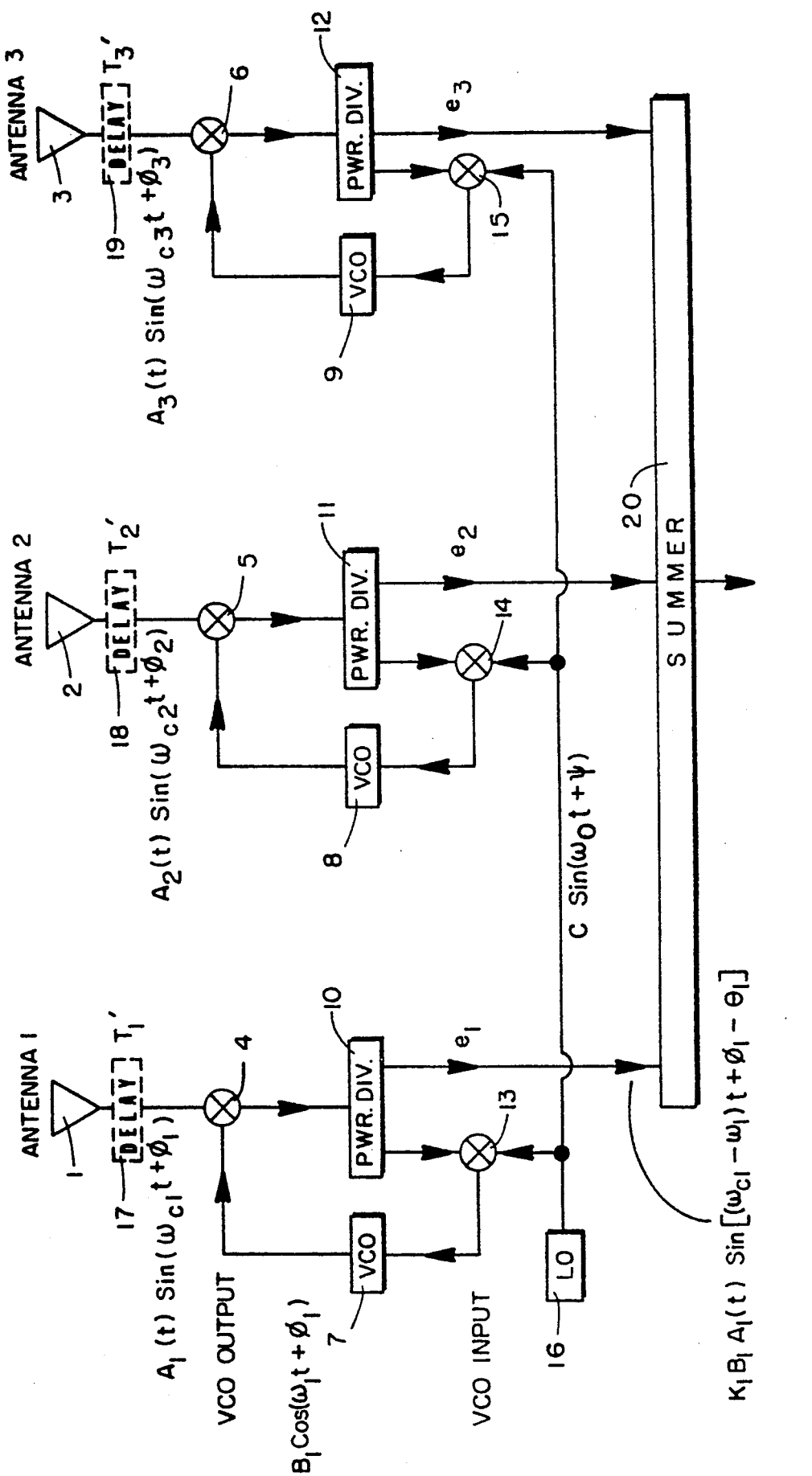
FIG. 1 is a detailed block diagram of a plurality of adaptive phase-locked loop assemblies to effect carrier frequency and phase changes to a common carrier frequency and phase so that the output of the phase-locked loop assemblies can be summed coherently even when the input signal signals are noncoherent.

The present invention permits the combining of signals at different carrier frequencies with a common message to increase the effective signal strength and communication reliability. FIG. 1 shows a block diagram of the signal combining system where modulated signals having different carrier frequencies can be summed. In this figure, 1, 2, 3 represent antennas, each tuned to receive one of the broadcast signals. The number of such antennas are not restricted to 3 as shown in the figure. Instead, three antennas are chosen to illustrate the principle of operation of the invention. Let the signal received by Antenna 1 be represented by $A_1(t) \operatorname{Sin}(w_{c1}t+\phi_1)$ where $A_1(t)$ is the time varying amplitude of the signal corresponding to an amplitude modulation, although the operation of the system, as will be explained later, is not limited to amplitude modulated broadcast signals. Here t denotes time, $w_{c1}$ denotes the angular carrier frequency selected for Antenna 1, and is equal to $2\pi$ times the corresponding carrier frequency selected for Antenna 1. The electrical phase angle $\phi_1$ denotes the phase of the carrier for the signal selected for Antenna 1. The components denoted by Nos. 4, 5 and 6 are mixers. As may be seen from the Antenna 1 circuit, the two inputs to the mixer 4 are the signal from the antenna and from the voltage controlled oscillator 7. Here the voltage controlled oscillator is defined as an oscillator whose output frequency and phase can be changed by a dc-like voltage applied to its input. Similar other voltage controlled oscillators No. 8 and 9 are used for the circuits of Antennas 2 and 3 as shown in the figure. Let the output of the voltage controlled oscillator 7 be $B_1 \cos(w_1 t + \theta_1)$ where $B_1$ is an amplitude factor, $w_1$ is $2\pi$ times the frequency $f_1$ and $\theta_1$ is the phase of the signal at the output of the voltage controlled oscillator 7. The output of the mixer 4, following appropriate filtering, can be expressed as $$K_1 B_1 A_1(t) \operatorname{Sin}[(w_{c1}-w_1)t+\phi_1-\theta_1)],$$

$K_1$ being a constant representing a gain or loss factor associated with mixer 4. The output of the mixer 4 is fed to the power divider 10, that has two outputs. As shown in the figure, two similar power dividers, 11 and 12 are used for the circuits of Antennas 2 and 3 respectively. One of the outputs of the power divider 10 is fed to the phase detector 13 as one of the two inputs of this phase detector, the other input being a signal from the local oscillator 16, denoted by $C \operatorname{Sin}(w_o t + \psi)$ where C is an amplitude factor, $w_o$ is the angular frequency and $\psi$ is the phase of the local oscillator signal. The components 14 and 15 denote other two phase detectors being used for circuits of Antennas 2 and 3 respectively, as shown in the figure. The output of the phase detector 13 will contain a signal, the angular frequency and phase of which will be $(w_{c1}-w_1-w_o)$ and $(\phi_1-\theta_1-\psi)$ respectively. If this output is used to control the frequency $f_1$ and phase $\theta_1$ of the voltage controlled oscillator 7, by closing the loop as shown in the figure, $f_1$ and $\theta_1$ will change as long as both $(w_{c1}-w_1-w_o)$ and $(\phi_1-\theta_1-\psi)$ are not zero. At the equilibrium condition of the loop, both $(w_{c1}-w_1-w_o)$ and $(\phi_1-\theta_1-\psi)$ will be zero. Thus the second output of the power divider 10, not connected to the phase detector 13 will contain a signal that can be represented as:

$$\begin{aligned} e_1 &= K_1 B_1 A_1(t) \operatorname{Sin}([w_{c1}-w_1]t + \phi_1 - \theta_1) \\ &= K_1 B_1 A_1(t) \operatorname{Sin}(w_o t + \psi) \end{aligned}$$

since, at the equilibrium condition, $$w_{c1}-w_1=w_o \text{ and } \phi_1-\theta_1=\theta_1-\psi.$$

Following the same logic, the output of the power divider 11 can be written as $$e_2 = K_2 B_2 A_2(t) \operatorname{Sin}(w_o t = \psi)$$

and that of the power divider 12 can be written as $$e_3 = K_3 B_3 A_3(t) \operatorname{Sin}(w_o t = \psi)$$

$A_2(t)$, $A_3(t)$ being the time varying amplitudes of the signals tuned by the Antennas 2 and 3 respectively, and $B_2$, $B_3$ are the amplitudes of the output signals of the voltage controlled oscillator signals 8 and 9 respectively. Similarly $K_2$ and $K_3$ are gain or loss factors for the mixers 5 and 6 respectively. Thus the signal output of the summer 20 which sums the signals $e_1$, $e_2$, $e_3$, etc., can be written as $$\begin{aligned} e_1 + e_2 + e_3 &= \left( \sum_{i=1}^{3} K_i B_i A_i(t) \right) \operatorname{Sin}(w_o t + \psi) \\ &= \left( M \sum_{i=1}^{3} A_i \right) \operatorname{Sin}(w_o t + \psi) \end{aligned}$$

when each $K_i B_i$ is equal to M.

The summed output then provides a signal which is equivalent in signal strength as the coherently summed signals at the Antennas 1, 2 and 3.

In the above discussion it is assumed that, for the propagation paths involved for the signals arriving at the Antennas 1, 2, and 3 from their respective sources, the amplitudes of the signal can be represented as $A_1(t)$, $A_2(t)$, $A_3(t)$, etc. When such propagation paths are very large, $A_1(t)$, $A_2(t)$, $A_3(t)$, etc., in above equations have to be replaced by $A_1(t+\tau_1)$, $A_2(t+\tau_2)$, $A_3(t+\tau_3)$ where t is some reference time and $(\tau_1-\tau_2)$, $(\tau_2-\tau_3)$, $(\tau_3-\tau_1)$, etc., denote time delays due to differential propagation path distances from the source of the respective signals to the Antennas 1, 2, 3, etc. For such cases, additional delays $\tau_1'(17)$, $\tau_2'(18)$, and $\tau_3'(19)$ are introduced in the inventive apparatus, between the Antenna 1 and Mixer 4, and Antenna 2 and Mixer 5, and between Antenna 3 and Mixer 6 respectively, such that $$\tau_1+\tau_1'=\tau_2=\tau_2'=\tau_3=\tau_3,$$

The additional time delays $\tau_1'$, $\tau_2$, $\tau_3'$, etc, are introduced, if needed, manually or automatically.

Figure 2:
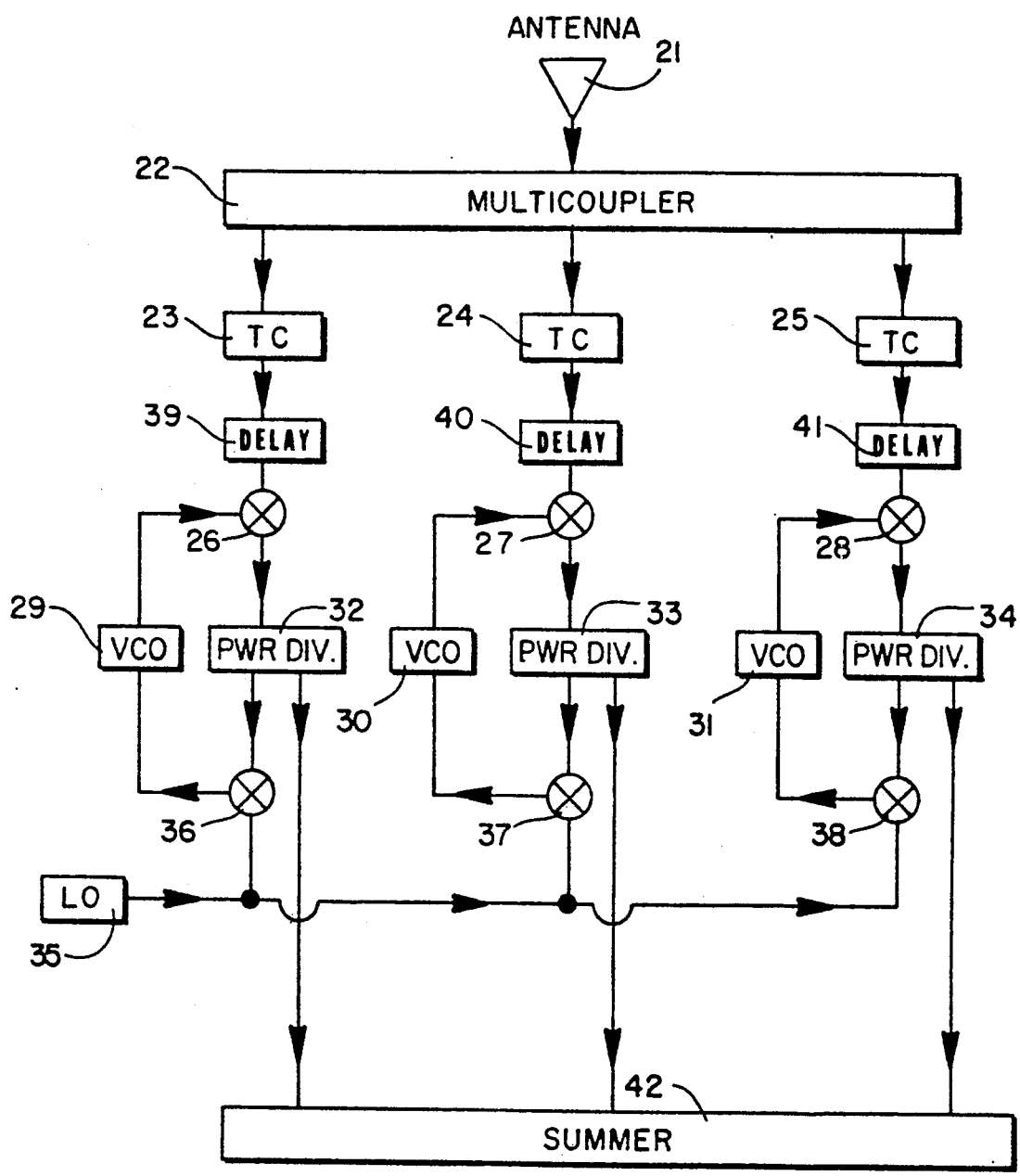
FIG. 2 is a detailed block diagram of a plurality of phase-locked loop assemblies, all receiving signals from the same antenna and are used for coherent summation of a set of oncoming signals, having different carrier frequencies and phases but a common modulation.

Another embodiment of the inventive apparatus is shown in FIG. 2. Here a singal Antenna 21 receives all signals, having different carrier frequencies but a common modulation. This antenna is connected to a multicoupler 22 that has as many output ports as the number of signals having abovesaid characteristics present at the Antenna 21. Each of the output ports 23, 24, 25 is turned to one of the carrier frequencies of the signals under consideration by a tuned circuit(.)—that serves as a bandpass filter permitting the passage of only one of said signals with the common modulation. Each tuned circuit output is fed to a delay line 39, 40 or 41 similar to delay lines 17, 18 and 19 in FIG. 1 which are introduced, if needed, to accommodate the effect of different propagation paths for different signals on modulation. The delay lines make the total time delay for modulation the same for all signals, notwithstanding their different propatation path distances.—Each—(tuned circuit)—delay line output—is fed to a closed, phase-locked loop assembly comprising, for example, the mixer 26, VCO 29, power divider 32, and phase detector 36; or the mixer 27, VCO 30, power divider 33, and phase detector 37; or the mixer 28, VCO 31, power divider 34, and phase detector 38, the signal from the same local oscillator 35 being used as a reference signal for each of the phase detectors 36, 37, and 38.

Figure 3:
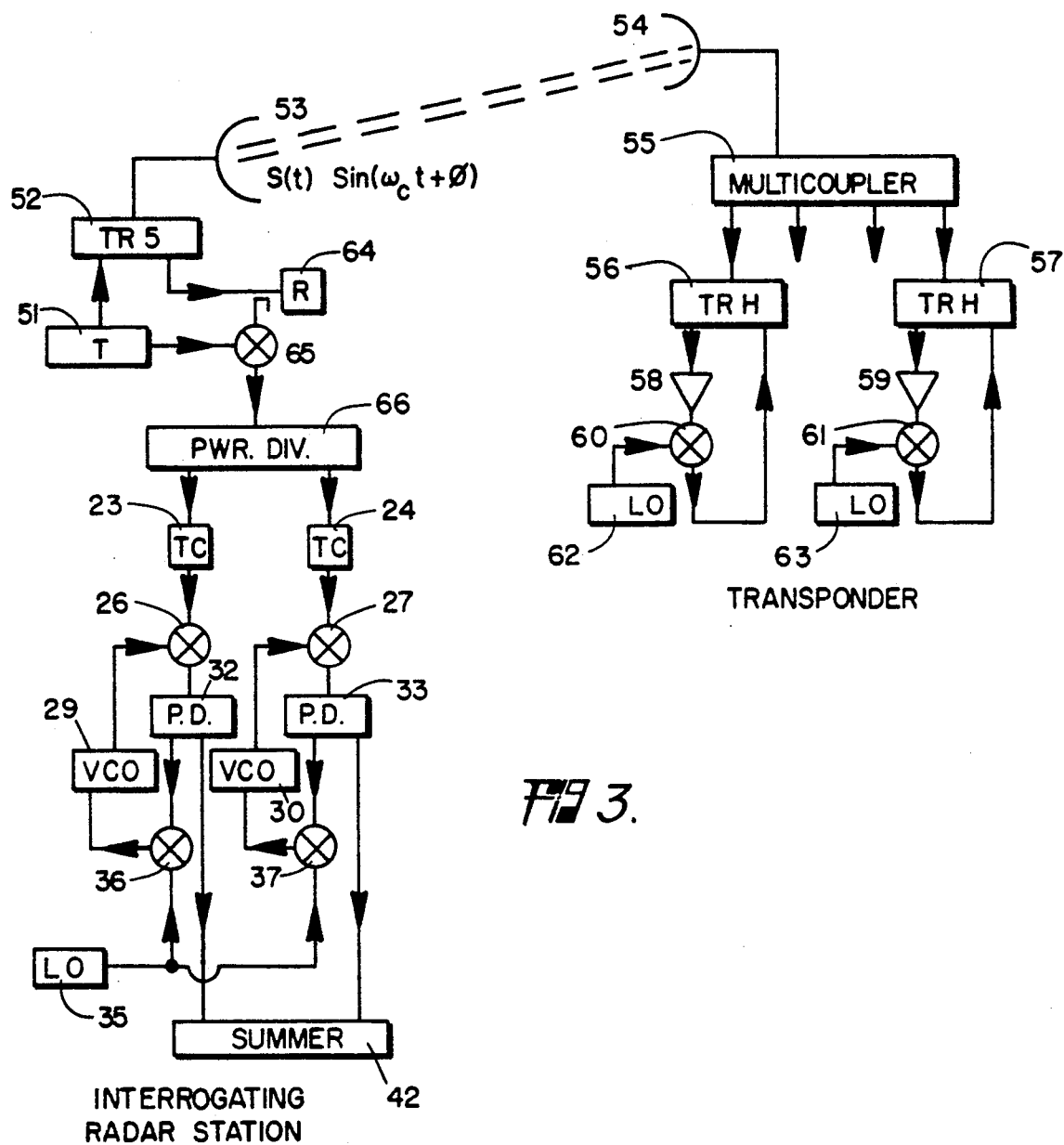
FIG. 3 is a block diagram of a radar transmitting an interrogating signal to a platform and the platform transmitting in response, a set of frequency shifted carriers that can be used for unique identification of the platform.

Still another embodiment of the inventive apparatus is shown in FIG. 3, where the combining of signals coherently along with a radar provides a unique identification and location means, similar to the Identification, Friend or Foe, (IFF) system for moving platforms such as airplanes. As shown in the figure, a radar transmits an interrogatory pulse-modulated signal from its transmitter 51, and Antenna 53, through a transmit/receive switch 52 which selects the operation of the radar transmitter or receiver. This transmitted signal is received at the platform by Antenna 54 and is divided into a number of ports through the multicoupler 55. Each such output port of the multicoupler is connected to a transmit-receive hybrid, 56, 57, etc., for example. Circuit details for only two ports are shown in the figure and similar circuits for other output ports of the multicoupler 55 are assumed.

The receive-side of these transmit-receive hybrids is connected to an amplifier 58 or 59 for example, as shown in the figure. The output of each amplifier is led to a mixer 60 or 61. A set of local oscillators, 62, 63, etc., generating signals at different designated frequencies also feed the mixers 60, 61, etc. The output of the mixers following appropriate filtering are transmitted back from antenna 54, through the transmit-side of abovesaid hybrids 56, 57, etc., and the bidirectional multicoupler 55.

The principle of operation of the approach can be further explained by considering the radar transmitting a signal at the Antenna 53. Let this signal be $$e_T = A(t) \, \text{Sin} \, (w_c t + \phi)$$

where A(t) is time-varying amplitude, $W_c + 2\pi$ times the radar carrier frequency and $\phi$ is the carrier phase. This signal appears at antenna 54 as $$e_R = K \, A(t+\tau) \, \text{Sin} \, (w_c[t+\tau] + \phi)$$

the time delay $\tau$ being equal to the ratio of the propagation path distance and the velocity of propagation of the radar signals and K is a constant depending on the propagation path distance. The signal transmitted by the same antenna following frequency shifts by the local oscillators 62, 63, etc., can be written as $$e_{T1} = KA(t + \tau) \sum_{i=1}^{N} K_i \, \text{Sin}([w_c - w_i][t + \tau] + \phi)$$

where $K_i$ is the total effective amplitude gain introduced by the amplifier, mixer, etc., at the ith circuit associated with the ith multicoupler output port, i being equal to 1, 2, 3 ... N. Here, the multicoupler is assumed to have N ports. Also $w_i$ is $2\pi$ times the offset frequency introduced at the ith port. As this signal, transmitted by Antenna 54, is received by the radar Antenna 53, it is led to the receiver 64 through the transmit/receive switch 52. A part of this signal is branched off and is fed to a mixer 65 which mixes the received signal with the radar carrier. The output of the mixer 65 and the input of the multicoupler 66, following appropriate filtering to eliminate $w_c$ then, can be written as $$\overline{K}A(t + 2\tau) \sum_{i=1}^{N} K_i \, \text{Sin}[w_i t + \phi + \theta_i]$$

where $\overline{K}$ is a different constant, and $\theta_i$ is a phase angle associated with the shifted angular frequency $w_i$.

The remainder of the signal procesing circuits beginning with the multicoupler 66 in FIG. 3 are the same as those shown in FIG. 2, beginning with the multicoupler 22. Thus, the tuned circuits 23, 24, etc., tune one of the offset frequencies, $w_i$, introduced at the platform and the summer provides, in effect, a coherent summation of the modulations. It may be noted from FIG. 3 that the coherent summation of modulations is possible only when the offset frequencies $w_i$s at the platform are known at the radar. If now a unique set of offset frequencies, $w_i$s, are assigned to a particular platform, then receiving a summed signal at the summer 42 when the tuned circuits 23, 24, etc., are tuned to those specific offset frequencies of the platform will indicate a positive identification of the platform. The direction of the radar Antenna 53 and the measured delay $2\tau$, by means used by a radar for range finding, provide the location of the platform as viewed from the radar.

When the offset frequencies, $w_i$ s, are spread over a wide frequency band, an unwanted interception of the signal radiated from the platform will be difficult since the intercepter must receive the signal over the entire band occupied by the offset frequencies thereby making the signal-to-noise ratio too poor for meaningful utilization of the received signal. Thus the identification signal radiated by the platform should be contrasted with a broadcast signal usually transmitted in the conventional IFF system where the identification and location of the platform are easily obtained by anyone including an unfriendly or hostile receiver. Unless the set of offset frequencies assigned to the platform is a-priori known to an interrogator or interceptor, the identification of the platform will be denied to him by the use of the inventive apparatus.

In FIG. 3 it is shown that the transponder signal radiated by Antenna 54 has the same modulation as the interrogating signal. This restriction, however, is not necessary. For example, a pulse-width different from that of the interrogating signal received by Antenna 54 may be introduced at the output of the mixers 60 and 61 before transmitting the mixer-output signals through the transmit-receive hybrids 56 or 57, the multicoupler 55 and the Antenna 54, as long as this new pulsewidth modulation is common to all offset-frequency carriers transmitted from Antenna 54. Means of introducing a different pulsewidth by phase locking the carrier first and then modulating with a common new pulsewidth is well known and is therefore not discussed here.

The identification and location approach as illustrated by an example shown in FIG. 3 can further be extended to communication from the platform to the interrogator making such a communication difficult to intercept by an unauthorized or unwanted receiver. Thus, for example, if one set of offset frequencies are assigned as a "Mark" signal and another set as "Space" signal, the ommunication from the platform as intended for him, without making such a communication susceptible to interception by an unauthorized receiver. The set of offset frequencies can be changed periodically to make the interception further difficult.

Figure 4:
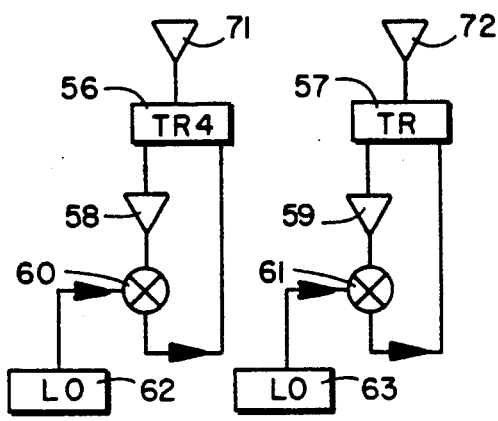
FIG. 4 is a block diagram showing the platform transmitting a set of frequency-shifted carriers from a plurality of antennas located at the platform.

FIG. 4 shows another embodiment of the identification and location approach where a single antenna 54 at the platform is replaced by a plurality of antennas such as 71, 72, etc. In this case, the radar signal received by each antenna is retransmitted with an offset in carrier frequency without affecting the modulation, the offset frequency for each antenna being different. The arrangement for retransmission involving transmit-receive hybrids (56, 57), amplifiers (58, 59), mixers (60, 61), and local oscillators (62, 63, etc.) are the same as shown in FIG. 3. The receiver for such an identification and location signal from the platform by the plurality of antennas, remains the same, as shown in FIG. 3. One advantage of the plurality of antennas at the platform is to avoid the multicoupler loss of signals in both directions. Another advantage of the plurality of antennas is to make the interception more difficult since the radiated signals from randomly located antennas become more incoherent because of the random phases introduced due to the antenna locations. Also, when the signals from such antennas are summed at the summer as shown in FIG. 3, the interrogator or the authorized receiver of the identification signal obtains an equivalent phased-array type antenna gain which is not available to an unauthorized receiver. Again, communication from the platform is feasible by employing one set of offset frequencies for "Mark" signal and another set for the "Space" signal with a Frequency Shift Keying (FSK) type of modulation.

The above described embodiments and methods are furnished as illustrations of the principles of the invention and are not intended to define the only embodiments possible in accordance with the teachings of the invention. Rather, protection under the United States Patent Law shall be afforded to the invention as further defined in the claims.

I claim:

1. An adaptive closed-loop controlled, signal combining system for multi-carrier-frequency signals, each having the same modulation, enhancing thereby the signal-to-noise ratio of the combined signal with respect to that of any individual signal comprising:
   (a) a sensor that receives signals radiated from a plurality of sources, each signal having a different carrier frequency, but a common modulation;
   (b) a plurality of bandpass filters, same in number as the number of said sources, each filter having an input and an output, the input of each filter being connected to said sensor such that the output of each filter corresponds to the radiated signal from only one of said sources;
   (c) means for changing, automatically, said carrier frequency and the carrier phase of the signal at the output of each said filter, to a common carrier frequency and a common phase without affecting the modulation; and
   (d) means for summing the signal at each filter line after its carrier frequency and phase are changed to a common carrier frequency and a common phase to effect coherent addition of modulation of each of said signals.

2. An adaptive signals combining system as in claim 1 wherein the incoming multifrequency signals at the output of said sensor, having different carrier frequencies but a common modulation, are hetrodyned, prior to allowing the signals to flow through the plurality of filters, with a signal from a common local oscillator to yield a set of signals, each having a carrier frequency and phase different from those of the same signal at the input of said sensor, but having the same modulation.

3. A signal combining system as in claim 1, wherein the means for automatically changing the carrier frequency and phase of each signal to a common carrier frequency and a common phase comprising:
   (a) a mixer with a first input port and a second input port and an output port, with the first input port connected to the source of the signal whose frequency and phase are to be changed;
   (b) a voltage-controlled-oscillator having an input port and an output port, the output port being connected to the second input port of said mixer;
   (c) a first filter to prevent the passage therethrough of undesired frequency components of the signal resulting from the mixer, the filter input being connected to the output port of said mixer;
   (d) a power divider having one input port and a first output port and a second output port, where the input port is connected to the output port of said first filter, the second output port being the port at which the signal with changed carrier frequency and phase appears;
   (e) a phase detector having a first input port and a second input port and an output port with the first input port connected to the first output port of said power divider;
   (f) A second filter to filter out undesired, mixed signal products resulting from said phase detector with the filter input connected to the output port of said phase detector, and the filter output connected to the input port of said voltage controlled oscillator; and
   (g) a common local oscillator connected to the second input port of said phase detector.

4. An adaptive signals combining system as in claim 1, wherein said bandpass filters comprise tuned circuits, each tuned circuit being tuned to the required center frequency of one of the bandbass filters and capable of passing the signals at frequencies required for that bandpass filter, at the output of the tuned circuit.

5. A method for adaptively combining a set of signals having different carrier frequencies and phases, but a common modulation, to enhance the signal-to-noise ratio of the combined coherent signal with respect to any individual signal which comprises:
   (a) receiving said multifrequency signals by a sensor;
   (b) separating the signals received by the sensor from different sources by a set of filters, wherein each filter output contains the signal of only one carrier frequency;
   (c) automatically changing the carrier frequency and carrier phase of the signal at the output of each of said filters to a common carrier frequency and common phase, by a phase-locked loop, without affecting the common modulation of the signals; and (d) summing the signals with their carrier frequencies and phases changed to a common carrier frequency and a common phase for signal enhancement.

6. An adaptive closed-loop controlled signal combining system for multi-carrier frequency signals comprising:
   (a) a transmitter that radiates a modulated signal along with a carrier frequency;
   (b) a distant interrogated object that can receive said radiated signal from said transmitter;
   (c) means for emitting a plurality of signals from said object as a transponder, each signal comprising a carrier frequency which is obtained by a different frequency offset from the carrier frequency, of said received signal, the modulation of the signal remaining unchanged;
   (d) a sensor collocated with said transmitter capable of receiving the signals emitted from the object;
   (e) a mixer with a first and a second input port and an output port with the first input port connected to said sensor and the second input port coupled to said transmitter carrier frequency source so that the output of the mixer yields a set of new signals each new signal having one of said offset frequencies as the carrier, and each signal having the same common modulation;
   (f) a plurality of bandpass filters, same in number as the number of different offset carrier frequencies, each filter being tuned to one offset carrier frequency and having an input port and an output port, the input port of each filter being connected to the output port of said mixer;
   (g) means for automatically changing said offset carrier frequency and the corresponding phase of the signal at the output of each said filter to a common carrier frequency and a common phase without affecting the modulation; and
   (h) means for summing the signal at each filter line after its carrier frequency and phase are changed to a common carrier frequency and a common phase.

7. An adaptive multifrequency signal combining system as in claim 6 wherein the offset frequencies at the transponder of the object are selected according to a code and the bandpass filters are tuned to the same set of frequencies as selected, thereby creating an identification means for the object.

8. An adaptive multifrequency signal combining system as in claim 6, wherein the means of emitting the plurality of signals, with their carrier frequencies derived from the received signal carrier frequency and signals from different local oscillators comprises:
   (a) a sensor to receive the modulated signal from the transmitter;
   (b) a signal power divider, the input of which is connected to said sensor and the output signal is equally divided at a plurality of ports;
   (c) a plurality of mixers, each with a first input port and a second input port, and an output port with the first input port connected to one of the output ports of the power divider, the second input port connected to a local oscillator providing an offset frequency which is different for different mixers; and
   (d) means of radiating the outputs of said mixers.

9. An adaptive multifrequency signal combining system as in claim 6 wherein the means of emitting the plurality of signals comprises:
   (a) a plurality of antennas located at various parts of the object, each receiving the modulated transmitted signal from the transmitter;
   (b) a plurality of mixers, each with a first input port and second input port, and an output port with the first input port connected to one of said antennas, and the second input port connected to a local oscillator, providing at the output port of said mixer an offset frequency which is different for different mixers; and
   (c) means of radiating the output of said mixers toward said transmitter.

10. An adaptive multifrequency signal combining system as in claim 6 wherein the same antenna is used at the interrogated object to receive the signal from the transmitter and radiate the output of said mixers toward said transmitter through a transmit-receive hybrid.

11. An adaptive multifrequency signal combining system as in claim 6 wherein the modulation of the radiated signals from the object is different from the modulation to the signal received at the object from said transmitter.

12. A method for combining, by a closed-loop controlled approach, multi-carrier frequency signals, all derived from an interrogating signal, that can be used for identification of an object comprising:
   (a) transmission of an interrogatory signal in the form of a modulated signal on a carrier frequency toward a distant object;
   (b) transponding from the object a plurality of signals each created by a different but preselected frequency offset of said carrier frequency of the transmitted signal, but each having the same modulation;
   (c) receiving said plurality of signals from the object by a sensor collocated at said transmitter;
   (d) separating out the signals as received by said sensor through bandpass filters tuned to same preselected frequency offsets as introduced by the object, such that output of each filter contains the signal of only one offset carrier frequency and a common modulation;
   (e) automatically changing the carrier frequency and phase of the signal at the output of each filter to a common carrier frequency and a common phase without affecting the modulation of the signal; and
   (f) summing the common-carrier-frequency and common-phase signals to effect coherent sum of modulation of the transponded signals.

* * * * *